United States Patent [19]

Palmer

[11] Patent Number: 5,306,584
[45] Date of Patent: Apr. 26, 1994

[54] MASK OR WAFER WRITING TECHNIQUE

[75] Inventor: Shane R. Palmer, Dallas, Tex.

[73] Assignee: Texas Instruments Incorporated, Dallas, Tex.

[21] Appl. No.: 722,795

[22] Filed: Jun. 28, 1991

[51] Int. Cl.⁵ .............................. G03F 9/00
[52] U.S. Cl. ........................ 430/5; 430/311; 430/319; 430/320
[58] Field of Search ............ 430/5, 311, 319, 320

[56] References Cited

U.S. PATENT DOCUMENTS 4,780,382  10/1988  Stengl et al. .................. 430/5

OTHER PUBLICATIONS

Physcia Scripta. vol. 41, pp. 13–20, 1990 "X-ray/VUV Transmission Gratings for Astrophysical and Laboratory Applications"; M. L. Schattenberg et al.

"A new approach to high fidelity e-beam and ion-beam lithography based on an in situ global-fiducial grid", H. I. Smith et al., J. Vac. Sci. Technol. B., vol. 9, No. 6, Nov./Dec. 1991, pp. 2992–2995.

Primary Examiner—Marion E. McCamish
Assistant Examiner—Mark A. Chapman
Attorney, Agent, or Firm—Ira S. Matsil; James C. Kesterson; Richard L. Donaldson

[57] ABSTRACT

A photolithographic mask or a directly written wafer has a pattern formed on a substrate 320. A grid pattern 316 and a layer of resist material 322 are formed on the substrate 320. The grid pattern 316 may be either above or beneath the resist material 320. The grid pattern 316 is scanned, by an e-beam or optical beam for example, without substantially reacting the resist layer 320 to obtain information on the location of the grid pattern 316. Portions of the resist material 320 are then exposed to form a device pattern. The device pattern is determined in part from the information and is also formed over the grid pattern 316. Other systems and methods are also disclosed.

21 Claims, 3 Drawing Sheets

MASK OR WAFER WRITING TECHNIQUE

FIELD OF THE INVENTION

This invention generally relates to the fabrication of semiconductor devices and specifically to an improved mask or wafer writing technique.

BACKGROUND OF THE INVENTION

One method to form an image on a mask for photolithographic processing is to scan an energy beam, such as an electron beam, across a resist material on the mask. The energy beam is turned on and off as it is scanned across the mask so that the desired image is transferred to the mask pattern.

When transferring the image to the photo or x-ray mask, the alignment of the pattern with regard to a known marker is critical. Since most photolithographic fabrication sequences require multiple levels which precisely overlie one another, it is imperative that the corresponding patterns are correctly aligned. In addition, errors which may be caused by distortions in the energy beam, focus distortions, magnetic distortions, thermal distortions, or physical aberrations such as vibration or stresses may cause non-uniformities within the mask surface as it is being written to. If these anomalies vary between different mask levels, overlapping problems will exist and difficulties will occur with the device performance or yield or design efficiency (e.g., efficient use of wafer area) or all.

In conventional mask writing systems, grid markings are formed in the mask prior to transferring the pattern. These grid markings are typically formed on the outer portions of the mask where no active chips will be formed. The energy beam equipment can then reference from these markings and use this information to ensure the multiple mask levels will be aligned.

Several problems exist with the prior art. The grids are spaced relatively far apart and therefore the resolution is not great enough to eliminate the effects of many of the distortions as described above.

In other conventional circuit writing systems, the grid markings are sometimes formed on the border of the circuit and in places within portions of the circuit. In this case, the circuit layout must be designed around the marks or alternatively, the marks must be placed in less than optimum positions or in less than optimum number of marks (using two or three marks instead of four) on the circuit. In all cases, the alignment marks take up additional valuable surface area. This technique only partially solves the problem of spacing the grid marking too far apart but in turn greatly complicates the circuit design. In many densely packed circuits, such as memory arrays, this loss in surface area is intolerable.

Accordingly, improvements which overcome any or all of the problems are presently desirable.

SUMMARY OF THE INVENTION

Other objects and advantages will be obvious, and will in part appear hereinafter and will be accomplished by the present invention which provides a method and apparatus for an improved mask and wafer writing technique.

A photolithographic mask is formed on a mask substrate. A grid pattern and a layer of resist material are formed on the substrate. The grid pattern may be either above or beneath the resist material. The grid pattern is scanned, by an e-beam or optical beam for example, without substantially reacting the resist layer to obtain information on the location of the grid pattern. Portions of the resist material are then exposed to form a device pattern. The device pattern is determined in part from the information learned while scanning the grid pattern and is also formed in part over the grid pattern.

An advantage of the invention is that the grid pattern has high enough resolution that mask distortions may be eliminated but does not significantly affect the device being fabricated. Use of the present invention will minimize overlay problems in patterning masks (e.g., x-ray masks).

The grid pattern marks do not interfere with the chip design since they are made of sufficiently transparent material (e.g., thin metal, semiconductor, or insulator 20–40 nm) to the radiation used in the exposure (e.g., between 0.8 and 1.2 nm for x-ray). This allows for patterning over the marks saving valuable real estate on the process area.

In addition, the marks allow for a relaxation of the patterning accuracy of the direct write tool (e.g., an e-beam tool). In other words, the overlay specification may be relaxed.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The marking and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the present invention. The preferred embodiment will be described first followed by a description of modifications. The method of using the invention will then be described.

Figure 1A:
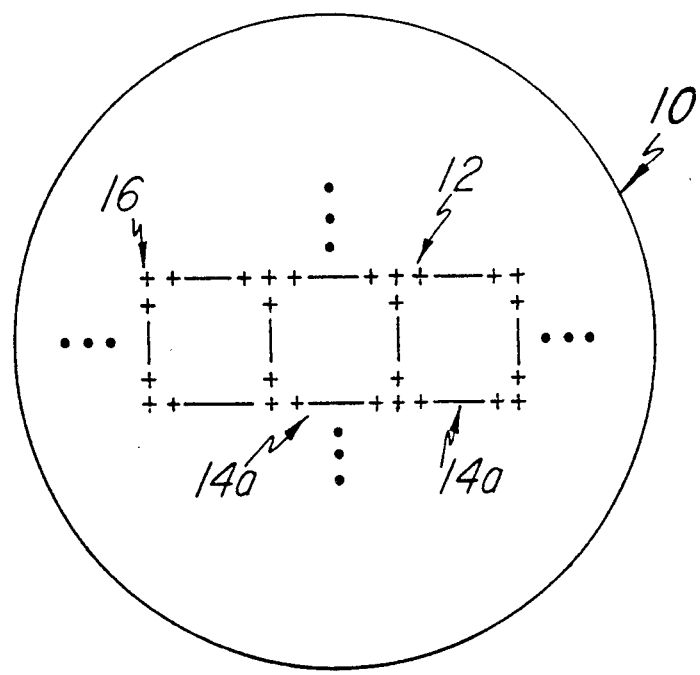
FIG. 1a shows a greatly enlarged view of a layout on a mask and 1b and 1c show alternate layout patterns.

Referring first to FIG. 1a, a portion of a substrate 10 is shown with reference grid markings 12 formed in the surface thereof. The substrate 10 is typically a mask, such as an x-ray or optical mask, but may also be a semiconductor wafer which is being direct written to. It should be noted that the illustration shown in FIG. 1 is not drawn to scale as there may be thousands of chips formed on the substrate 10 and each chip may have a great number of markings 12. As such, the substrate 10 may have as many as ten's of thousands of grid markings or more.

The grid markings 12 are formed on the substrate with the use of a master mask. In other words, for the case where a mask set is being fabricated, one master mask with the reference grid pattern will be formed and used to formed the grid pattern on each of the masks in the set. The different masks are then used to fabricate devices without interference from the grid markings. In the case of a directly written substrate, the grid pattern may need to be formed and removed between each level in the multilevel device.

Figure 1B:
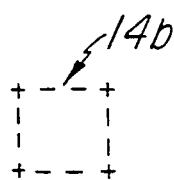
Figure 1C:
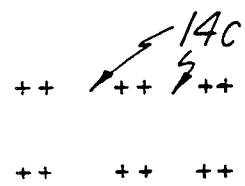

As illustrated in FIG. 1a, the grid markings 12 may be formed in a repetitive pattern throughout the mask. In this example, the mask 10 is partitioned into small squares 14a, each defined by three grid markings 16 at each corner. Other possible grid patterns 14b and 14c are shown in FIGS. 1b and 1c respectively. The choice of grid pattern is based on the scanning method of the e-beam system and therefore may be any other patterns of choice.

As an aspect of the present invention, the grid markings 12 may be formed throughout the mask including locations where active devices will be formed. The direct write of a pattern onto the substrate will occur in two phases. First a low power beam will scan the area to be written and calibrate based upon the location of the reference grid marks. This scan must occur so that it does not write to the resist. After the calibration has been completed, the pattern of interest will be written within the scan field.

An advantage of having a single grid reference pattern on all the masks in a multilevel process is that each level will be individually calibrated against a common standard. In other words, if a deformation occurs in the mask substrate while it is being written to, the grid pattern will also deform. The defects of the deformation are in turn negated when the scan phase calibrates each field. This method assumes that there is no drift between when the calibration and writing occur—typically a valid assumption.

In general, the concept is to utilize an absolute grid on a master mask which can be placed on subsequent masks. This grid is used by the electron beam lithography machine to perform accurate field stitching and overlay from mask to mask. The grid size is dependent upon two requirements, and the grid marks are either conductor or semiconductor materials but are essentially transparent to x-rays (e.g., thin). It is also required that the e-beam can align on the grid marks without exposing the resist. In one example, the data from the Philips EBPG system shows that this is achievable at tens' of picoamps with gold marks on gallium arsenide. Also needed is sufficient contrast between the mark and membrane material or high contrast between the mark and the absorber material.

The reference grid pattern may be formed using either optical or x-ray technology to form a master reference mask. Optical technology may be preferred since a 5× mask can be used and this will improve resolution. The key is that each of the mask levels of a single device include a grid reference pattern from the same master mask.

In designing the master reference grid mask, the number of grid markings is designed based upon the tradeoff of time and accuracy. The more often the e-beam is calibrated, the more accurate the pattern transfer will be but the longer the write process will take. The number of grids must then be determined by the requirements of each application. Of course, not all the grids need to be used during each write process.

Figure 2:
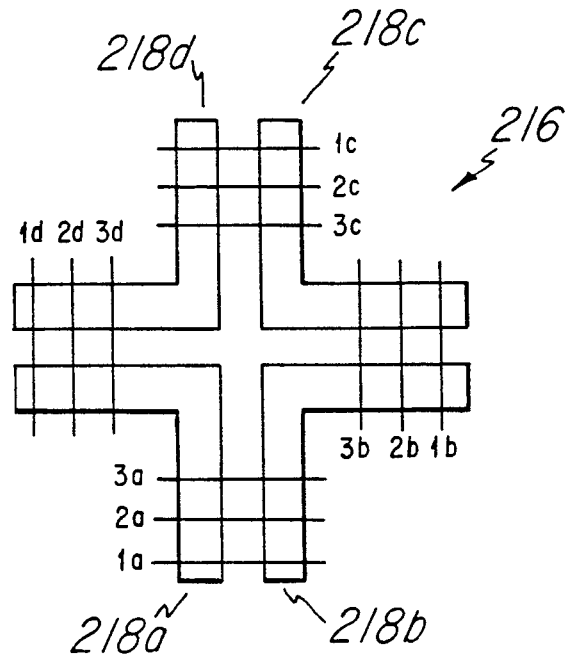
FIG. 2 shows an exemplary grid marking.

FIG. 2 illustrates a closeup view of an exemplary grid marking 216. In this example, the grid marking 216 includes four separate portions 218a–218d. In a preferred embodiment, each marking portion 218 is between about 1 and 5 microns in length. With this length, as many as 50 scans are more may be possible in different locations without developing their resist. In FIG. 2, scan lines are illustrated as 1a, 1b, 1c, 1d, 2a, etc.

A better understanding of the present invention will be gained from the cross-sectional views which are illustrated in FIGS. 3 through 6.

Figure 3:
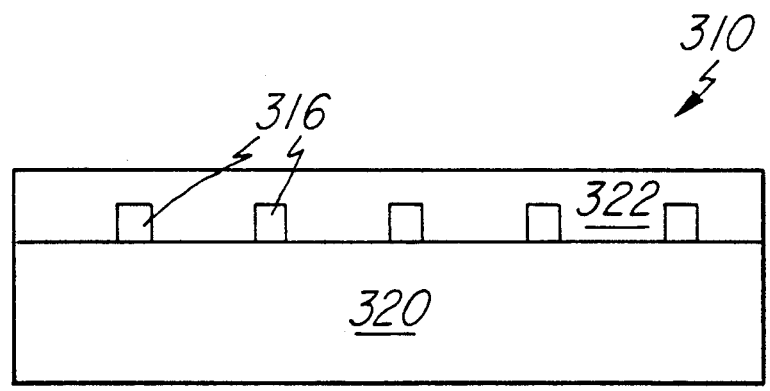
FIGS. 3–6 illustrate cross-sectional views of preferred embodiment grid layouts.

Referring now to FIG. 3, substrate 320 is provided. Grid markings 316 are formed on the substrate and will be used as the reference markings. A layer of resist 322 is formed over the markings 316. The resist layer 322 is sensitive to the write beam which may be an e-beam. Resist technology is well known in the art. The grid markings 316 are typically formed to give a contrast of the grid marks from the substrate material. This can be performed with either a high back scatter material such as gold, germanium, or silicon or a low backscatter material. Another way to provide contrast at the grid is by making protrusions or trenches on the substrate material and using the edge scatter for alignment.

After the pattern (not shown) has been formed, and the resist 322 removed, the grid markings 316 may be removed. If the grid markings 316 are made from a material transparent to the mask, however, the markings may remain on the mask. For example, if the mask is an x-ray mask and the grid markings are thin enough (typically on the order of 100–500 Å), the grid markings will be transparent to the x-rays and therefore to do need to be removed. On the other hand, if the substrate 320 is a direct written wafer and the grid markings will interfere with the next level, they must be removed.

To form the grid pattern in the case with an additive mask, the thin marks are placed on the membrane from the master reference mask, the pattern is developed and then the marks are either etched or deposited. These marks may be left on the mask since they do not significantly effect the contrast of the exposure. The resist layer is then formed to create the mask pattern.

In the previous case, the alignment marks are placed on the x-ray metal absorber. First the marks are defined by using the master mask which has the common grid to be used from mask to mask. In this case, the mask must have sufficient contrast to the x-ray metal absorber. Hence, the marks could be in other metal with sufficient electron cross-section difference or even a semiconductor or insulating material.

Figure 4:
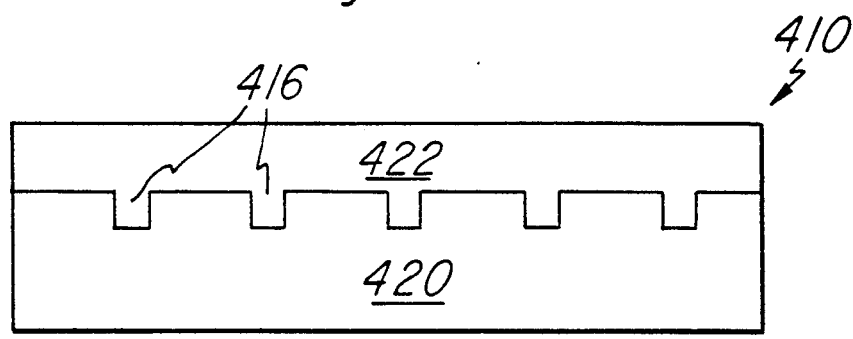

Another embodiment mask 410 is shown in FIG. 4. In this example, the grid markings 416 are etched into the mask substrate 420. The resist layer 422 is formed above the grids. Once again, the important feature here is that the etched grid markings 416 will be transparent during the print operation (i.e., when wafers are formed from the mask 416).

Figure 5:
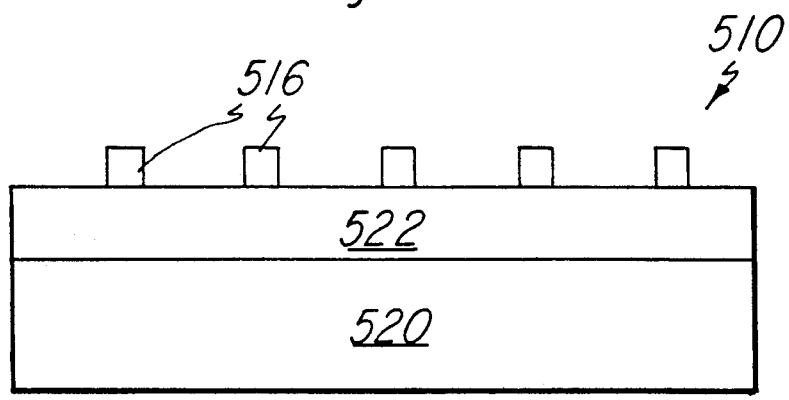

An alternate embodiment mask 510 is shown in FIG. 5. In this embodiment, the resist layer 522 is formed directly upon substrate 520 and the grid markings 516 are formed upon the resist layer 522. In this example, the grid markings 516 are removed when resist layer 522 is removed.

Figure 6:
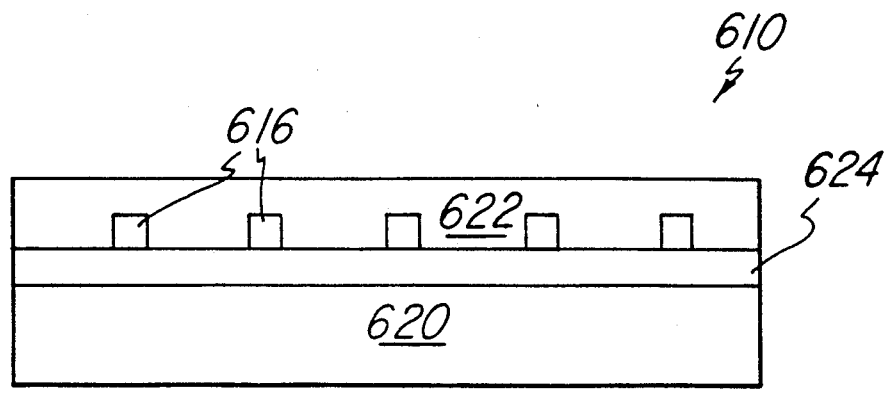

Yet another embodiment mask 610 is illustrated in FIG. 6. In this case, a high back scatter material 624 such as tungsten, gold, titanium tungsten, or tantalum is formed over a membrane material 620. Grid markings 616 are then formed above the material layer 624. Grid markings 616 are formed from a low back scatter material such as chromium or germanium. The 620 membrane typically comprises silicon or silicon carbon. This case once more illustrates the general point that any material can be used for the reference grid markings as long as: 1) there is a difference with the background material so that it is visible to the scan mechanism and 2) it will not substantially effect the write mechanism. In addition, the grid must be transparent so it will not interfere with the print operation or else must be removed before printing wafers begins.

In an alternate embodiment, the scan may be accomplished with one energy beam, such as an optical beam for example, and the pattern write formed with another energy beam, such as an electron beam. Once again, the scan beam must not substantially disturb the resist so that only the desired pattern is transferred to the mask.

Figure 7B:
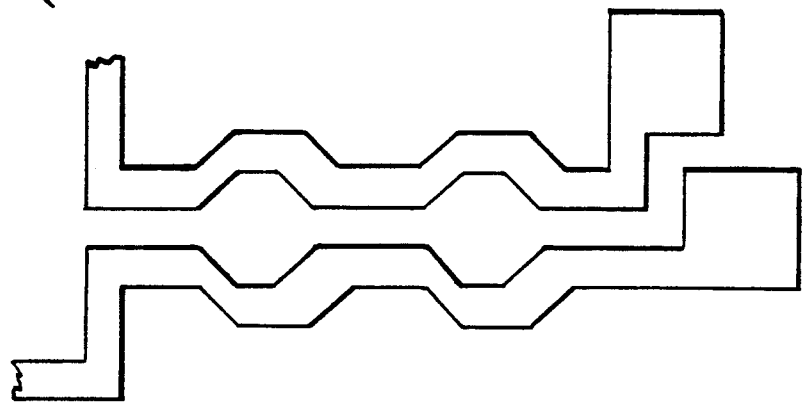
FIG. 7a illustrates an example of a pattern layout with the grid markings present and FIG. 7b illustrates the fabricated wafer which no longer includes the grid markings.
Figure 7A:
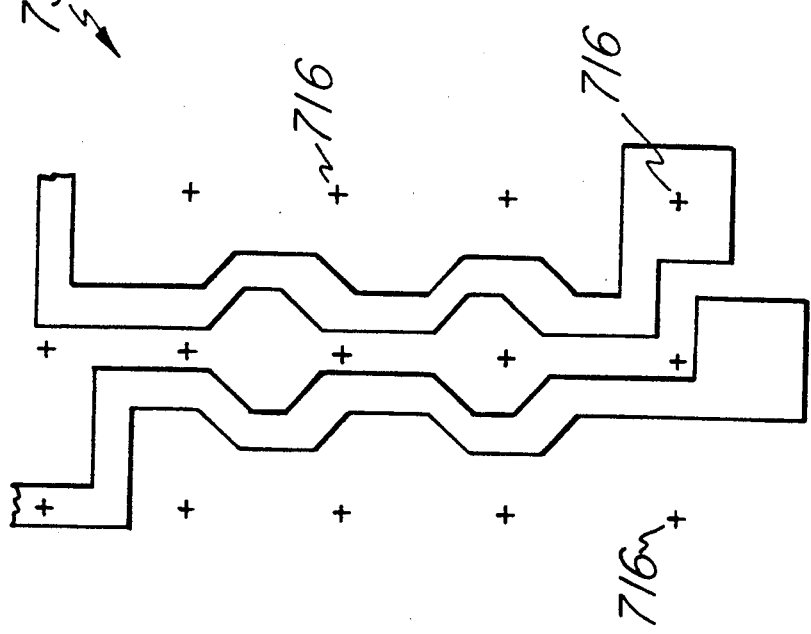

Referring now to FIG. 7a, an exemplary mask pattern 750a is illustrated. The example here illustrates the mask pattern for two lines (after the mask pattern has been written). In this case, the grid markings 716 have not been removed but rather remain on the mask. FIG. 7b illustrates a device 750b being fabricated from the mask 750a. Here the grid markings are no longer visible since the grid pattern is transparent to the photolithography method, such as x-ray or optical methods as examples.

When using the method of the present invention, several potential problems must be kept in mind so as to avoid later difficulties. During the alignment of the e-beam tool, the resist (above the absolute marks) is marginally exposed. This could cause dissolution of the resist in the area where the mark is located. This is true for insensitive alignment tools (schemes), however, using advanced signal processing, the total dose to the area (alignment mark area) by the tool would be insufficient to expose the resist yet could still perform adequate high precision alignment. This would be enhanced by utilization of increased voltages on the electron beam machine. Another technique could be used to avoid this effect is to employ an optical alignment on the reference grid marks instead of the e-beam. A technique such as linear fresnel zone plate or grading has been used to align with accuracies up to 0.06 microns at 3 sigma. A laser of wavelength which does not have a large absorption cross section in the resist could be used (true for 400 nm to 800 nm for most e-beam resists).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a photolithographic mask comprising the steps of:
   forming a grid pattern on a mask substrate;
   forming a layer of resist material on said substrate;
   scanning said grid pattern without substantially reacting said resist layer to obtain calibration information on the location of said grid pattern;
   reacting portions of said resist material by exposing said portions with energy from an energy source to form a device pattern, wherein said grid pattern is substantially transparent to said energy, said device pattern determined in part from said calibration information and formed at least in part over said grid pattern; and
   removing said resist material.

2. The method of claim 1 wherein said grid pattern is formed on said substrate and said layer of resist is formed over said grid pattern.

3. The method of claim 2 wherein said grid pattern is etched into said substrate and said layer of resist is formed over said grid pattern such that said device pattern is formed over said etched grid pattern.

4. The method of claim 1 wherein said layer of resist is formed on said substrate and said grid pattern is formed on said layer of resist such that said grid pattern is removed when said resist material is removed.

5. The method of claim 1 wherein said grid pattern is removed subsequent to said exposing step.

6. The method of claim 1 wherein said scanning step comprises scanning with an e-beam and said reacting step comprises exposing with an e-beam.

7. The method of claim 1 wherein said scanning step comprises scanning with an optical beam and said reacting step comprises exposing with an e-beam.

8. The method of claim 1 wherein mask comprises an x-ray mask.

9. The method of claim 1 wherein said grid pattern is formed from a master reference grid pattern.

10. The method of claim 9 and further comprising forming said grid pattern on a second mask substrate.

11. The method of claim 9 wherein master reference grid pattern is formed optically.

12. A method of directly writing a pattern onto a semiconductor wafer to form active semiconductor devices comprising the steps of:
   forming a grid pattern on a semiconductor wafer substrate;
   forming a layer of resist material on said substrate;
   scanning said grid pattern without substantially reacting said resist layer to obtain calibration information on the location of said grid pattern;
   exposing portions of said resist material to form a device pattern, said device pattern determined in part from said calibration information and said device pattern formed over said grid pattern, said device pattern comprising one level of an active semiconductor circuit; and
   removing said resist material and said grid pattern.

13. The method of claim 12 wherein said grid pattern is formed on said substrate and said layer of resist is formed over said grid pattern.

14. The method of claim 12 wherein said layer of resist is formed on said substrate and said grid pattern is formed on said layer of resist.

15. The method of claim 12 wherein said grid pattern and said resist material are removed in a single step.

16. The method of claim 12 wherein said scanning step comprises scanning with an e-beam and said exposing step comprises exposing with an e-beam.

17. The method of claim 12 wherein said scanning step comprises scanning with an optical beam and said exposing step comprises exposing with an e-beam.

18. A mask to be used in fabricating semiconductor devices comprising:
   a substrate;

a reference grid pattern formed on said substrate, said device pattern formed on said substrate such that energy from an energy source can pass through a portion of said substrate, wherein said grid pattern is substantially transparent to said energy, said device pattern formed independently of said grid pattern such that portions of said device pattern overlap portions of said grid pattern.

19. The mask of claim 18 wherein said grid pattern is formed from high back scatter material.

20. The mask of claim 18 wherein said energy source comprises an x-ray source.

21. A method of forming a mask set including a plurality of masks to be used for the photolithographic processing of a device, said method comprising the steps of:

forming a master mask with a reference grid formed thereon;

providing a mask substrate;

patterning said mask substrate with said master mask to form said reference grid on said mask substrate;

forming a device pattern on said mask substrate wherein said device pattern is formed from a material which is substantially opaque to energy from a selected energy source and said reference grid is formed from a material which is substantially transparent to said energy source; and repeating said step of providing, patterning and forming a device pattern for each mask of said plurality of masks which requires a reference grid.

* * * * *